(12) United States Patent
Ko

(10) Patent No.: US 8,385,145 B2
(45) Date of Patent: Feb. 26, 2013

(54) SEMICONDUCTOR MEMORY APPARATUS

(75) Inventor: Bok Rim Ko, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 251 days.

(21) Appl. No.: 12/843,808

(22) Filed: Jul. 26, 2010

(65) Prior Publication Data

US 2011/0026341 A1 Feb. 3, 2011

(30) Foreign Application Priority Data

Jul. 30, 2009 (KR) .................. 10-2009-0070092

(51) Int. Cl.
*G11C 29/00* (2006.01)
(52) U.S. Cl. ....................... 365/201; 365/200
(58) Field of Classification Search .......... 365/200, 365/201

See application file for complete search history.

(56) References Cited

U.S. PATENT DOCUMENTS

| 5,553,025 | A | | 9/1996 | Haraguchi |
| 5,617,366 | A | * | 4/1997 | Yoo ................. 365/201 |
| 5,864,510 | A | | 1/1999 | Nakaoka |
| 6,058,495 | A | * | 5/2000 | Lee et al. ............ 714/718 |
| 6,546,512 | B1 | | 4/2003 | Ochoa et al. |
| 6,842,033 | B1 | | 1/2005 | Kim et al. |
| 6,854,078 | B2 | * | 2/2005 | Kinoshita et al. ....... 714/718 |
| RE40,172 | E | * | 3/2008 | Do .................... 365/189.07 |
| 2003/0067805 | A1 | * | 4/2003 | Roohparvar ......... 365/185.22 |
| 2003/0081479 | A1 | * | 5/2003 | Matsumoto et al. ..... 365/201 |
| 2003/0188238 | A1 | | 10/2003 | Partsch et al. |
| 2005/0213397 | A1 | | 9/2005 | Santin |
| 2006/0123291 | A1 | | 6/2006 | Kim |

FOREIGN PATENT DOCUMENTS

| JP | 01-173499 | 7/1989 |
| JP | 2004-045090 | 2/2004 |
| KR | 100576453 B1 | 4/2006 |
| KR | 100781973 B1 | 11/2007 |

* cited by examiner

*Primary Examiner* — Michael Tran
(74) *Attorney, Agent, or Firm* — William Park & Associates Ltd.

(57) ABSTRACT

A semiconductor memory apparatus includes memory banks, each having sub banks. The semiconductor memory apparatus is configured to allocate same test input/output line to a certain sub bank of one memory bank and a certain sub bank of another memory bank during a multi-bit test.

13 Claims, 3 Drawing Sheets

SEMICONDUCTOR MEMORY APPARATUS

CROSS-REFERENCES TO RELATED APPLICATION

The present application claims priority under 35 U.S.C. §119(a) to Korean application number 10-2009-0070092, filed on Jul. 30, 2009, in the Korean Intellectual Property Office, which is incorporated herein by reference in its entirety as set forth in full.

BACKGROUND

1. Technical Field

The present invention relates to a semiconductor memory apparatus, and more particularly to a semiconductor memory apparatus which uses a multi-bit test scheme.

2. Related Art

In order to ensure reliability of a semiconductor memory apparatus, various tests are performed on the apparatus during the manufacturing process or before placing a product on the market. Any increase in test time will increase the manufacturing cost, thus the tests are performed as quickly as possible. To accommodate quick testing, recently developed semiconductor memory apparatuses have adopted a multi-bit test scheme.

The multi-bit test scheme refers to a technique of performing read/write operations while all memory banks in a semiconductor memory apparatus are activated. In the multi-bit test scheme, tests are performed by configuring a plurality of input/output data as one test input/output data. For example, if input/output operations are performed by allocating first through fourth data input/output lines to a first memory bank, the input/output data of the first memory bank are allocated altogether to one test input/output line when performing a multi-bit test.

As newer semiconductor memory apparatuses operate at higher speeds, a split bank structure has been proposed in the art, which is capable of improving the operation speed without increasing the chip size. The split bank structure refers to a structure where one sub bank of one memory bank and one or more sub banks of another memory bank constitute a group.

For example, in the split bank structure, a first bank is split into first up and down banks, and a second bank is split into second up and down banks. The first up bank and the second up bank are arranged as one group, and the first down bank and the second down bank are arranged as one group. In this case, the lengths of data input/output lines can be made the same, and data access can be quickly implemented, by which the operating speed of the entire semiconductor memory apparatus can be increased.

However, in the semiconductor memory apparatus having the split bank structure, the test input/output line used in the multi-bit test is disposed at the center portion of the split banks unlike data input/output lines that are disposed in a peripheral circuit region. This causes problems when using the above described conventional multi-bit test scheme leading a test not being properly performed.

In the multi-bit test scheme, a plurality of input/output data are configured as one test input/output data such that the lengths of test input/output lines connecting respective banks vary in respective sub banks. If the lengths of test input/output lines vary in respective sub banks, a precise test result cannot be obtained.

SUMMARY

A semiconductor memory apparatus which can perform a multi-bit test by allocating data of different banks to one test input/output line is described herein.

In one embodiment of the present invention, a semiconductor memory apparatus is configured to allocate the same test input/output line to a certain sub bank of one memory bank and a certain sub bank of another memory bank during a multi-bit test.

In another embodiment of the present invention, a semiconductor memory apparatus comprises a first up bank and a first down bank constituting a first memory bank; and a second up bank and a second down bank constituting a second memory bank, wherein the first up bank and the second up bank are disposed to form one group, and the first down bank and the second down bank are disposed to form another group, and wherein the semiconductor memory apparatus is configured to allocate a first test input/output line to the first and second up banks and a second test input/output line to the first and second down banks during a multi-bit test.

In another embodiment of the present invention, a semiconductor memory apparatus is configured to allocate different test input/output lines to sub banks which are dispersed from each other and constitute one memory bank, during a multi-bit test.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through preferred embodiments.

Figure 1:
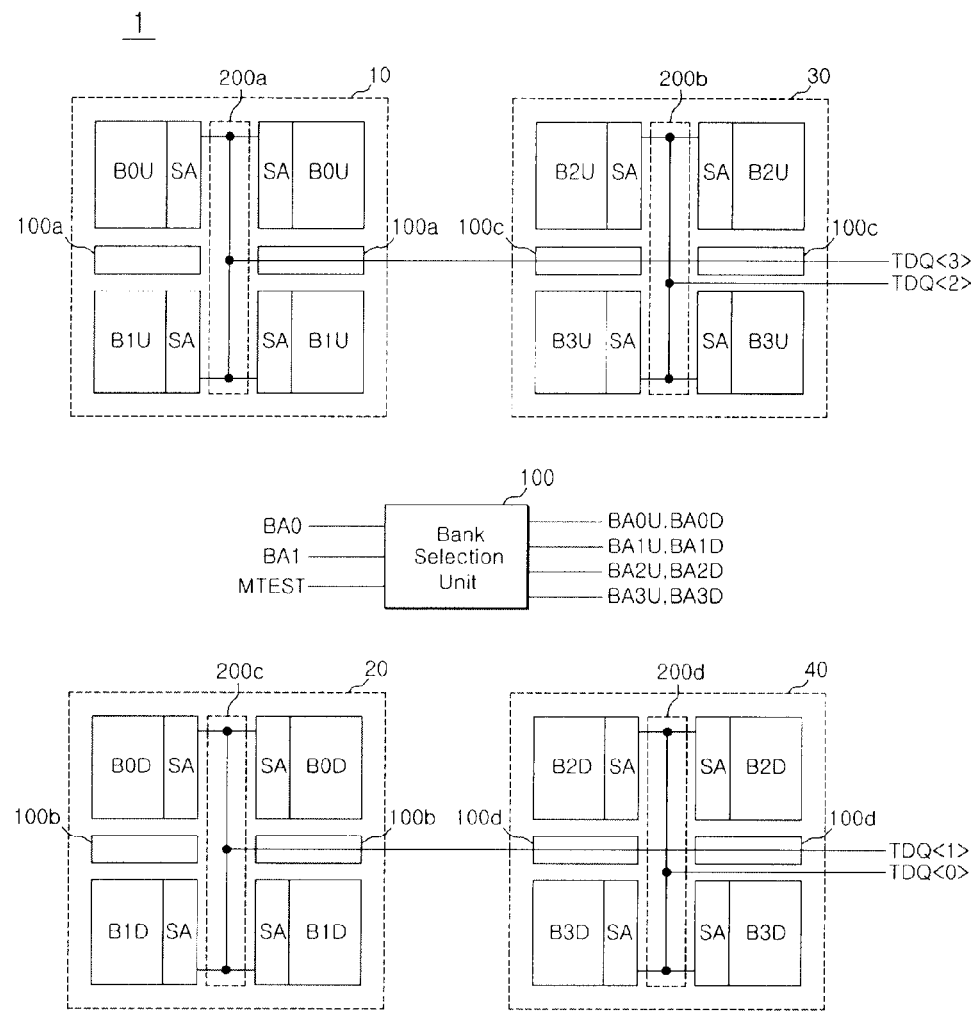
FIG. 1 is a diagram schematically illustrating the configuration of a semiconductor memory apparatus in accordance with an embodiment of the present invention.

FIG. 1 is a diagram schematically illustrating the configuration of a semiconductor memory apparatus in accordance with an embodiment of the present invention. Referring to FIG. 1, a semiconductor memory apparatus 1 includes first through fourth memory banks B0, B1, B2, B3. The first through fourth memory banks B0, B1, B2, B3 are comprised of a plurality of sub banks B0U, B1U, B2U, B3U and B0D, B1D, B2D, B3D. In FIG. 1, the first through fourth memory banks B0, B1, B2, B3 are comprised of up banks and down banks. The up banks and the down banks are the sub banks B0U, B1U, B2U, B3U and B0D, B1D, B2D, B3D of the first through fourth memory banks B0, B1, B2, B3, respectively.

In FIG. 1, in the semiconductor memory apparatus 1, a first up bank B0U and a second up bank B1U are arranged to constitute a first group 10, a first down bank B0D and a second down bank B1D are arranged to constitute a second group 20. Similarly, a third up bank B2U and a fourth up bank B3U are arranged to constitute a third group 30, and a third down bank B2D and a fourth down bank B3D are arranged to constitute a fourth group 40. In this way, a split bank structure is formed.

The actual input/output operations of the semiconductor memory apparatus 1 are performed by the respective banks.

That is, the split arranged first up bank B0U and first down bank B0D comprise the first memory bank B0 as such they are allocated with same data input/output line. In the same way, the second up bank B1U and the second down bank B1D, the third up bank B2U and the third down bank B2D, and the fourth up bank B3U and the fourth down bank B3D, each pair of which is allocated with same data input/output line. Namely, the data input/output lines coupled with the first through fourth memory banks B0, B1, B2, B3 are different from each other. In general, the data input/output lines are connected to data input/output pads through a peripheral circuit region between the first through fourth groups 10, 20, 30, 40, even though the sub banks (the pairs of up and down banks) of the first through fourth memory banks B0, B1, B2, B3 are arranged as being in different groups, the lengths (or loadings) of the data input/output lines can be made the same.

However, as described above, a test input/output line is not arranged in a peripheral circuit region but in the circuit region between the banks constituting one group (10 or 20 or 30 or 40). Thus, for example, when the sub banks comprising the first up bank B0U and the first down bank B0D constituting the first memory bank B0 are allocated with a same test input/output line, the distance (i.e., loading) from the first up bank B0U to a test input/output pad and the distance (i.e., loading) from the first down bank B0D to the test input/output pad are going to be different from each other, which is problematic.

Therefore, the semiconductor memory apparatus 1 in accordance with an embodiment of the present invention is configured such that the same test input/output line is allocated to a sub bank of one memory bank and a certain sub bank of another memory bank that is different from the former memory bank for a multi-bit test. In FIG. 1, for a multi-bit test, a first test input/output line TDQ<3> is allocated to the first up bank B0U and the second up bank B1U of the 1st group 10, and a second test input/output line TDQ<1> is allocated to the first down bank B0D and the second down bank B1D of the second group 20. Similarly, a third test input/output line TDQ<2> is allocated to the third up bank B2U and the fourth up bank B3U of the third group 30, and a fourth test input/output line TDQ<0> is allocated to the third down bank B2D and the fourth down bank B3D of the fourth group 40. Each of the first through fourth test input/output lines TDQ<0:3> can comprise one input/output line or two or more input/output lines. The first through fourth test input/output lines TDQ<0:3> are connected to respective test input/output pads, which of which is allocated to each of the first through fourth test input/output lines TDQ<0:3>.

While the same test input/output line (such as TDQ<0> or TDQ<1> or TDQ<2> or TDQ<3>) is allocated to a group (such as 10 or 20 or 30 or 40) having sub banks (such as up or down banks) from different memory banks (such as B0, B1, B2, B3) in the semiconductor memory apparatus 1, a bank selection unit 100 is provided such that the multi-bit test can be performed by respective memory banks (such as B0, B1, B2, B3).

The bank selection unit 100 can selectively activate the first through fourth memory banks B0, B1, B2, B3 during a multi-bit test. In detail, the bank selection unit 100 can simultaneously activate the sub banks B0U and B0D of the first memory bank B0 and the sub banks B2U and B2D of the third memory bank B2, and can simultaneously activate the sub banks B1U and B1D of the second memory bank B1 and the sub banks B3U and B3D of the fourth memory bank B3. The activation of the first and third memory banks B0, B2 and the activation of the second and fourth memory banks B1, B3 are selectively implemented. The first up bank B0U of the first memory bank B0 and the second up bank B1U of the second memory bank B1 are arranged to constitute the first group 10 and share the first test input/output line TDQ<3>. Accordingly, the first memory bank B0 and the second memory bank B1 can be selectively activated, as such the first test input/output line TDQ<3> can input/output data to and from the first up bank B0U in the multi-bit test for the first memory bank B0 and can also input/output data to and from the second up bank B1U in the multi-bit test for the second memory bank B1. In FIG. 1, the first group 10 is comprised of first and second up banks B0U and B1U, and the third group 30 is comprised of the third and fourth up banks B2U and B3U. Then, if the activation of the first memory bank B0 and the third memory bank B2 and the activation of the second memory bank B1 and the fourth memory bank B3 are selectively implemented, a multi-bit test operation can be performed for each of the respective memory banks even though the sub banks from different memory banks (that is, each of the groups 10, 20, 30, 40 is comprised of sub banks from different memory banks B1, B2, B3, B4) share a same test input/output line (i.e., one of TDQ<0:3>). In FIG. 1, the data of the sub banks B0U, B1U, B2U, B3U, B0D, B1D, B2D, B3D can be outputted to corresponding test input/output lines TDQ<0:3> through corresponding sense amplifiers SA, and the data of the test input/output lines TDQ<0:3> can be stored in the sub banks B0U, B1U, B2U, B3U, B0D, B1D, B2D, B3D through the sense amplifiers SA.

The bank selection unit 100 can selectively activate the first through fourth memory banks B0, B1, B2, B3 in response to a multi-bit test signal MTEST and bank address signals BA0 and BA1. In the bank selection unit 100, signals BA0U, BA1U, BA2U, BA3U, BA0D, BA1D, BA2D, BA3D for activating the first through fourth memory banks B0, B1, B2, B3 are transmitted to word line control circuits 100a, 100b, 100c, 100d, each of which is included in each of the respective groups. By activating the word lines of the sub banks B0U, BA1U, BA2U, BA3U, BA0D, BA1D, BA2D, B3D, the activation of the first through fourth memory banks B0, B1, B2, B3 is implemented.

The semiconductor memory apparatus 1 can further include row selection units 200a, 200b, 200c, 200d. The row selection units 200a, 200b, 200c, 200d are provided to selectively activate any one of two halves of the sub banks B0U, B1U, B2U, B3U, B0D, B1D, B2D, B3D. In FIG. 1, the row selection units 200a, 200b, 200c, 200d can selectively activate one of the two halves in each of the sub banks B0U, B1U, B2U, B3U, B0D, B1D, B2D, B3D, when the bank selection unit 100 and the row selection units 200a, 200b, 200c, 200d are used together. This allows one-fourth bank of one memory bank (that is, the left half or the right half of one sub bank or, for example, one half of the sub bank B0U) can be selected and activated. The row selection units 200a, 200b, 200c, 200d can selectively activate a half of each of the sub banks B0U, B1U, B2U, B3U, B0D, B1D, B2D, B3D in response to a row address signal RA (now shown in FIG. 1 but shown in FIG. 3 with respect to the row selection unit 200a).

Figure 2:
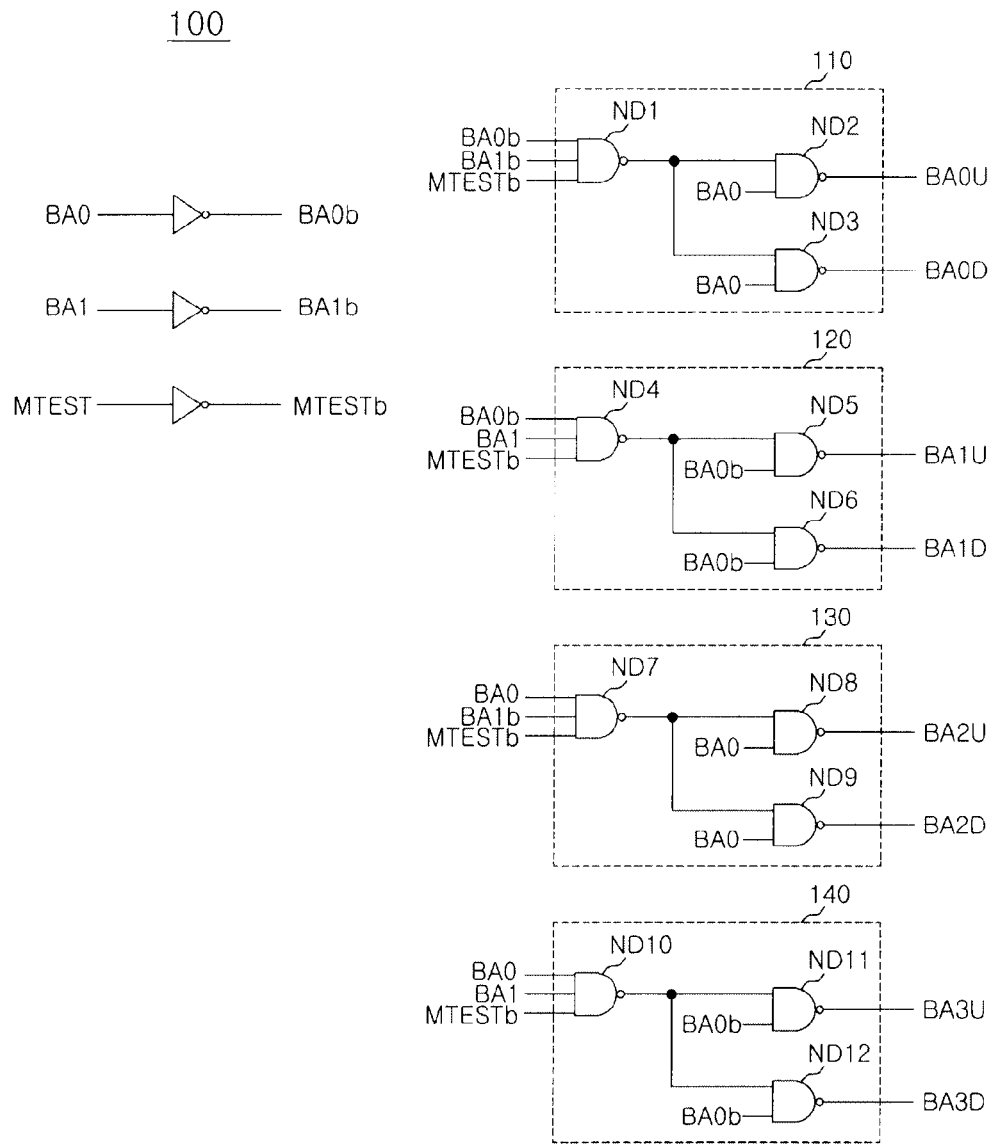
FIG. 2 is a diagram illustrating the configuration of an embodiment of a bank selection unit shown in FIG. 1.

FIG. 2 is a diagram illustrating the configuration of an embodiment of the bank selection unit 100 shown in FIG. 1. Referring to FIG. 2, the bank selection unit 100 is configured to generate the signals BA0U, BA0D, BA1U, BA1D, BA2U, BA2D, BA3U, BA3D for selectively activating the first through fourth memory banks B0, B1, B2, B3 in response to the multi-bit test signal MTEST and the bank address signals BA0 and BA1. The multi-bit test signal MTEST can use a test mode signal which instructs the performing of the multi-bit test. The bank address signals BA0, BA1 are a plurality of address signals which are inputted to select memory banks which constitute the semiconductor memory banks. For example, the bank address signals can be made of two signals for a semiconductor memory apparatus comprised of four memory banks (such as B0, B1, B2, B3 shown in FIG. 1). Hereinbelow, an embodiment of the present invention will be described with respect to the semiconductor memory apparatus 1 having four memory banks B0, B1, B2, B3. When the multi-bit test signal MTEST is disabled, the bank selection unit 100 selectively activates the first through fourth memory banks B0, B1, B2, B3 in response to the first and second bank address signals BA0, BA1. When the multi-bit test signal MTEST is enabled, that is, in a multi-bit test operation, the bank selection unit 100 selectively activates the first and third memory banks B0, B2 or the second and fourth memory banks B1, B3 in response to the first bank address signal BA0. Accordingly, the bank selection unit 100 can selectively activate the respective memory banks B0, B1, B2, B3 using the first and second bank address signals BA0, BA1 while in a normal operation but not in a multi-bit test operation. Alternatively, the bank selection unit 100 can selectively implement activation of the first and third memory banks B0, B2 and activation of the second and fourth memory banks B1, B3 in a multi-bit test operation so as to allow the multi-bit test to be performed.

In FIG. 2, the bank selection unit 100 can include first through fourth decoders 110, 120, 130, 140. The first through fourth decoders 110, 120, 130, 140 are configured to generate the signals BA0U, BA0D, BA1U, BA1D, BA2U, BA2D, BA3U, BA3D for selectively activating the first through fourth memory banks B0, B1, B2, B3, in response to the first bank address signal BA0, the second bank address signal BA1, and the multi-bit test signal MTEST. The first decoder 110 generates the signals BA0U and BA0D for selecting the first up bank B0U and the first down bank B0D of the first memory bank B0. The second decoder 120 generates the signals BA1U and BA1D for selecting the second up bank B1U and the first down bank B1D of the second memory bank B1. Similarly, the third decoder 130 generates the signals BA2U and BA2D for selecting the third up bank B2U and the third down bank B2D of the third memory bank B2. The fourth decoder 140 generates the signals BA3U and BA3D for selecting the fourth up bank B3U and the fourth down bank B3D of the fourth memory bank B3.

The first through fourth decoders 110, 120, 130, 140 can generate the signals BA0U, BA0D, BA1U, BA2D, BA3U, BA3D for activating the first through fourth memory banks B0, B1, B2, B3 depending upon the combination of the first and second bank address signals BA0 and BA1 when the multi-bit test signal MTEST is disabled.

The first through fourth decoders 110, 120, 130, 140 can generate the signals BA0U, BA0D, BA2U, BA2D for activating the first and third memory banks B0, B2 or the signals BA1U, BA1D, BA3U, BA3D for activating the second and fourth memory banks B1, B3 depending upon whether the first bank address signal BA0 is enabled, when the multi-bit test signal MTEST is enabled. In other words, if the multi-bit test signal MTEST is enabled, using only the first bank address signal BA0, the first and third memory banks B0, B2 can be simultaneously activated or the second and fourth memory banks B1, B3 can be simultaneously activated.

In FIG. 2, each of the first through fourth decoders 110, 120, 130, 140 can include three NAND gates. The first decoder 110 includes first through third NAND gates ND1, ND2, ND3. The first NAND gate ND1 receives inverted signals BA0b and BA1b of the first and second bank address signals BA0 and BA1 and an inverted signal MTESTb of the multi-bit test signal MTEST. Hence, if the multi-bit test signal MTEST is disabled, since the inverted signal MTESTb has a high level, the first NAND gate ND1 outputs signals having different levels depending upon the levels of the inverted signals BA0b and BA1b of the first and second bank address signals BA0 and BA1. Therefore, the first decoder 110 can enable or disable the signals BA0U, BA0D for activating the first memory bank B0, depending upon the combination of the first and second bank address signals BA0, BA1. Conversely, if the multi-bit test signal MTEST is enabled, since the inverted signal MTESTb has a low level, the first NAND gate ND1 output a signal of a high level regardless of the first and second bank address signals BA0, BA1. At this time, since the second and third NAND gates ND2, ND3 receive the output of the first NAND gate ND1 and the first bank address signal BA0, if the first bank address signal BA0 has a low level, the second and third NAND gates ND2, ND3 output the signals BA0U, BA0D of a high level, and if the first bank address signal BA0 has a high level, the second and third NAND gates ND2, ND3 output the signals BA0U, BA0D of a low level.

The third decoder 130 includes seventh through ninth NAND gates ND7, ND8, ND9. The seventh NAND gate ND7 receives the first bank address signal BA0, the inverted signal BA1b of the second bank address signal BA1, and the inverted signal MTESTb of the multi-bit test signal MTEST. Therefore, if the multi-bit test signal MTEST is disabled, the third decoder 130 can enable or disable the signals BA2U, BA2D for activating the third memory bank B2, depending upon the levels of the first and second bank address signals BA0, BA1. If the multi-bit test signal MTEST is enabled, the seventh NAND gate ND7 outputs a signal of a high level. Since the eighth and ninth NAND gates ND8, ND9 receive the output of the seventh NAND gate ND7 and the first bank address signal BA0, the eighth and ninth NAND gates ND8, ND9 can output the signals BA2U, BA2D of different levels depending upon the first bank address signal BA0. In this way, since the second and third NAND gates ND2, ND3 of the first decoder 110 and the eighth and ninth NAND gates ND8, ND9 of the third decoder 130 commonly receive the first bank address signal BA0, when the multi-bit test signal MTEST is enabled, the signals BA0U, BA0D, BA2U, BA2D for simultaneously activating the first and third memory banks B0, B2 can be generated or the first and third memory banks B0, B2 can be simultaneously deactivated, in response to the first bank address signal BA0.

The second decoder 120 including fourth through sixth NAND gates ND4, ND5, ND6 and the fourth decoder 140 including tenth through twelfth NAND gates ND10, ND11, ND12 operate similarly to the first and third decoders 110, 130. Since the fifth and sixth NAND gates ND5, ND6 of the second decoder 120 and the eleventh and twelfth NAND gates ND11, ND12 of the fourth decoder 140 receive the inverted signal BA0b of the first bank address signal BA0, when the multi-bit test signal MTEST is enabled, the signals BA1U, BA1D, BA3U, BA3D for simultaneously activating the second and fourth memory banks B1, B3 can be generated, or the second and fourth memory banks B1, B3 can be simultaneously deactivated.

Due to the above-described configuration, in a multi-bit test, if the first bank address signal BA0 has a high level, the bank selection unit 100 can deactivate the first and third memory banks B0, B2 and activate the second and fourth memory banks B1, B3. Conversely, if the first bank address signal BA0 has a low level, the bank selection unit 100 can activate the first and third memory banks B0, B2 and deactivate the second and fourth memory banks B1, B3.

Figure 3:
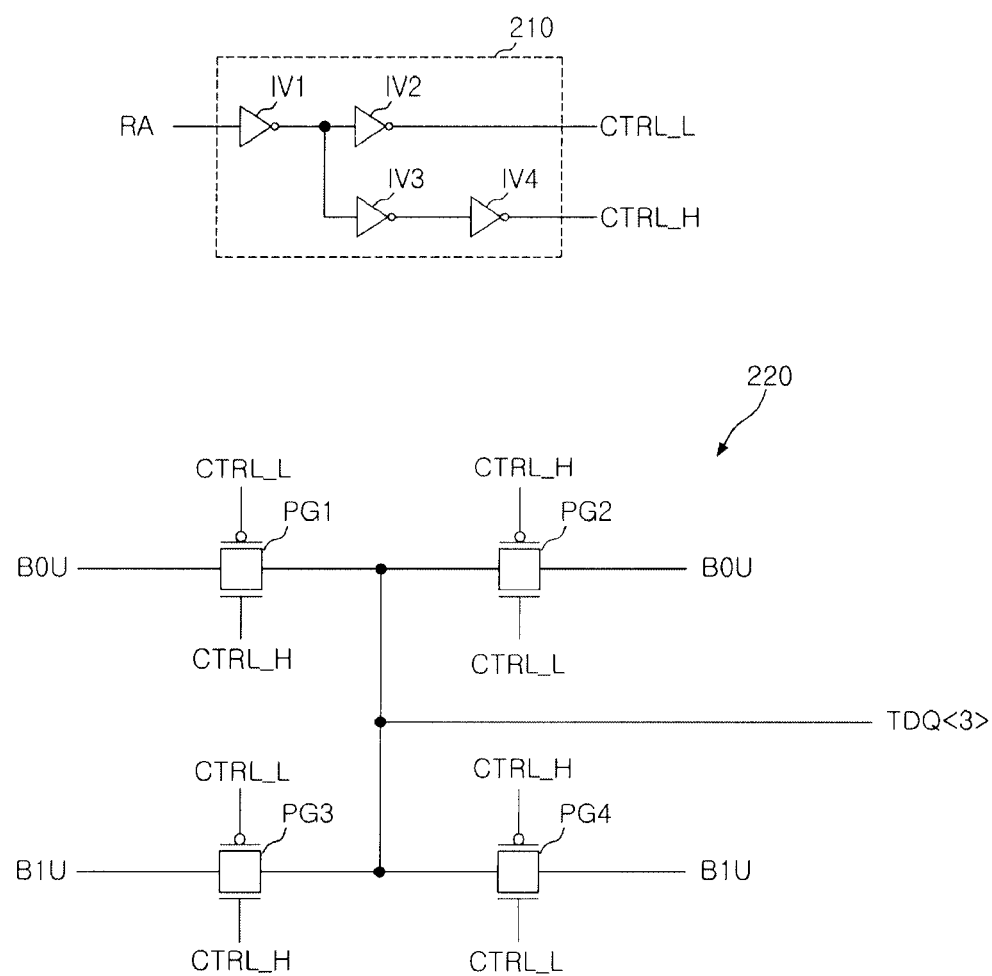
FIG. 3 is a diagram illustrating the configuration of an embodiment of a row selection unit shown in FIG. 1.

FIG. 3 is a diagram illustrating the configuration of an embodiment of the row selection unit 200a shown in FIG. 1. In FIG. 1, the row selection units 200a, 200b, 200c, 200d included in the first through fourth groups 10, 20, 30, 40 have the same configuration. Therefore, the row selection unit 200a included in the first group 10 will be described representatively. The row selection unit 200a includes a control section 210 and a selection section 220. The control section 210 is configured to receive the row address signal RA and generate control signals CTRL_L and CTRL_H. The row address signal RA is a signal which is inputted to select rows in a memory bank. In general, a semiconductor memory apparatus uses a plurality of row address signals. The row selection unit 200a can use an optional row address signal among the plurality of row address signals. The control section 210 can generate first and second control signals CTRL_L and CTRL_H of different levels depending upon the level of the row address signal RA. The control section 210 may be individually provided in the row selection unit 200a, 200b, 200c, 200d, or the row selection units 200a, 200b, 200c, 200d can commonly use one control section 210.

In FIG. 3, if the row address signal RA has a high level, the control section 210 enables the first control signal CTRL_L and disables the second control signal CTRL_H. Conversely, if the row address signal RA has a low level, the control section 210 disables the first control signal CTRL_L and enables the second control signal CTRL_H. The control section 210 may include first through fourth inverters IV1, IV2, IV3, IV4. The first inverter IV1 inverts the row address signal RA. The second inverter IV2 inverts the output of the first inverter IV1 and generates the first control signal CTRL_L. The third inverter IV3 inverts the output of the first inverter IV1. The fourth inverter IV4 inverts the output of the third inverter IV3 and generates the second control signal CTRL_H. Consequently, the control section 210 can generate the first and second control signals CTRL_L and CTRL_H of different levels depending upon the row address signal RA.

The selection section 220 includes first through fourth pass gates PG1, PG2, PG3, PG4. When turned on, the first pass gate PG1 connects the left half of the first up bank B0U with the first test input/output line TDQ<3>. When turned on, the second pass gate PG2 connects the remaining right half of the first up bank B0U with the first test input/output line TDQ<3>. When turned on, the third pass gate PG3 connects the left half of the second up bank B1U with the first test input/output line TDQ<3>. When turned on, the fourth pass gate PG4 connects the remaining right half of the second up bank B1U with the first test input/output line TDQ<3>. The first through fourth pass gates PG1, PG2, PG3, PG4 are turned on in response to the first and second control signals CTRL_L, CTRL_H. Since different control signals are applied to the control terminals of the first pass gate PG1 and the second pass gate PG2, the first and second pass gates PG1, PG2 are selectively turned on depending upon the levels of the first and second control signals CTRL_L, CTRL_H. Consequently, if the first pass gate PG1 is turned on, the left half of the first up bank B0U is coupled with the first test input/output line TDQ<3> so that data can be inputted/outputted, and if the second pass gate PG2 is turned on, the remaining right half of the first up bank B0U is coupled with the first test input/output line TDQ<3> so that data can be inputted/outputted.

Similarly, since different control signals are applied to the control terminals of the third pass gate PG3 and the fourth pass gate PG4, the third and fourth pass gates PG3, PG4 are selectively turned on depending upon the levels of the first and second control signals CTRL_L, CTRL_H. Consequently, if the third pass gate PG3 is turned is on, the left half of the second up bank B1U is coupled with the first test input/output line TDQ<3> so that data can be inputted/outputted, and if the fourth pass gate PG4 is turned on, the remaining right half of the second up bank B1U is coupled with the first test input/output line TDQ<3> so that data can be inputted/outputted.

Operations of the semiconductor memory apparatus 1 during the multi-bit test will be described with reference to FIGS. 1-3. If the multi-bit test signal MTEST is enabled for the multi-bit test and the first bank address signal BA0 has the high level, the bank selection unit 100 enables the signals BA0U, BA0D, BA2U, BA2D for activating the first and third memory banks B0, B2 and disables the signals BA1U, BA1D, BA3U, BA3D for activating the second and fourth memory banks B1, B3. Accordingly, the first up bank B0U of the first memory bank B0 which constitutes the first group 10 is activated, and the first down bank B0D of the first memory bank B0 which constitutes the second group 20 is activated. Similarly, the third up bank B2U of the third memory bank B2 which constitutes the third group 30 is activated, and the third down bank B2D of the third memory bank B2 which constitutes the fourth group 40 is activated. At this time, if the row address signal RA has the high level, the control section 210 generates the first control signal CTRL_L of the high level and the second control signal CTRL_H of the low level. Accordingly, the row selection units 200a, 200c allow the right halves of the first up bank B0U, the first down bank B0D, the third up bank B2U and the third down bank B2D to be respectively coupled with the first through fourth test input/output lines TDQ<0:3>, in response to the first and second control signals CTRL_L, CTRL_H. Conversely, if the row address signal RA has the low level, the row selection units 200a, 200c allow the left halves of the first up bank B0U, the first down bank B0D, the third up bank B2U, and the third down bank B2D to be respectively coupled with the first through fourth test input/output lines TDQ<0:3>. The multi-bit test can be performed for the first up bank B0U and the first down bank B0D as the sub banks of the first memory bank B0 and the third up bank B2U and the third down bank B2D as the sub banks of the third memory bank B2. That is, the data of the first through fourth test input/output lines TDQ<0:3> can be written in the first and third memory banks B0, B2, or the data of the first and third memory banks B0, B2 can be transmitted to the first through fourth test input/output lines TDQ<0:3> to perform a read operation.

If the first bank address signal RA has the low level, the bank selection unit 100 disables the signals BA0U, BA0D, BA2U, BA2D for activating the first and third memory banks B0, B2, and enables the signals BA1U, BA1D, BA3U, BA3D for activating the second and fourth memory banks B1, B3. Accordingly, the second up bank B1U of the second memory bank B1 which constitutes the first group 10 is activated, and the second down bank B1D of the second memory bank B1 which constitutes the second group 20 is activated. Similarly, the fourth up bank B3U of the fourth memory bank B3 which constitutes the third group 30 is activated, and the fourth down bank B3D of the fourth memory bank B3 which constitutes the fourth group 40 is activated. At this time, if the row address signal RA has the high level, the control section 210 generates the first control signal CTRL_L of the high level and the second control signal CTRL_H of the low level. Accordingly, the row selection units 200b and 200d allow the right halves of the second up bank B1U, the second down bank B1D, the fourth up bank B3U and the fourth down bank B3D to be respectively coupled with the first through fourth test input/output lines TDQ<0:3>, in response to the first and second control signals CTRL_L and CTRL_H. Conversely, if the row address signal RA has the low level, the row selection units 200b, 200d allow the left halves of the second up bank B1U, the second down bank B1D, the fourth up bank B3U, and the fourth down bank B3D to be respectively coupled with the first through fourth test input/output lines TDQ<0:3>. The multi-bit test can be performed for the second up bank B1U and the second down bank B1D as the sub banks of the second memory bank B1 and the fourth up bank B3U and the fourth down bank B3D as the sub banks of the fourth memory bank B3. That is, the data of the first through fourth test input/output lines TDQ<0:3> can be written in the second and fourth memory banks B1, B3, or the data of the second and fourth memory banks B1, B3 can be transmitted to the first through fourth test input/output lines TDQ<0:3> to perform a read operation.

As is apparent from the above description, in the semiconductor memory apparatus 1 having a split bank structure, a multi-bit test can be performed by allocating the same test input/output line to sub banks of different memory banks constituting one group. Accordingly, since the same lengths (or same loading) of test input/output lines are coupled with sub banks constituting one memory bank, a precise multi-bit test result can be obtained.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   memory banks, each memory bank comprising sub banks,
      wherein the semiconductor memory apparatus is configured to allocate the same test input/output line to one or more sub banks of one memory bank and one or more sub banks of another memory bank during a multi-bit test,
      wherein the semiconductor memory apparatus comprises a bank selection unit configured to select all sub banks of one memory bank.

2. The semiconductor memory apparatus according to claim 1, wherein the bank selection unit receives a multi-bit test signal and bank address signals and selects all sub banks of the memory bank.

3. The semiconductor memory apparatus according to claim 1, further comprising:
   a row selection unit configured to select any half of a sub bank of one memory bank, wherein each sub bank is comprised of two halves of memory units.

4. The semiconductor memory apparatus according to claim 3, wherein the row selection unit comprises:
   a control section configured to generate control signals in response to a row address signal; and
   a selection section configured to selectively communicate with any half of the sub bank of the memory bank in response to the control signals,
   wherein the selection section is coupled with the test input/output line.

5. A semiconductor memory apparatus comprising:
   a first memory bank comprising a first up bank and a first down bank; and
   a second memory bank comprising a second up bank and a second down bank,
   wherein the first up bank and the second up bank are arranged to form one group, and the first down bank and the second down bank are arranged to form another group, and
   wherein the semiconductor memory apparatus is configured to allocate a first test input/output line to the first and second up banks and a second test input/output line to the first and second down banks during a multi-bit test,
   wherein the semiconductor memory apparatus further comprises a row selection unit configured to select one half from each of the first up bank, the first down bank, the second up bank, and the second down bank and the other remaining half from each of the first up bank, the first down bank, the second up bank, and the second down bank,
   wherein each of the first up bank, the first down bank, the second up bank, and the second down bank is comprised of two halves of memory units.

6. The semiconductor memory apparatus according to claim 5, further comprising:
   a bank selection unit configured to: select both of the first up bank and the first down bank comprising the first memory bank; or select both of the second up bank and the second down bank comprising the second memory bank.

7. The semiconductor memory apparatus according to claim 6, wherein the bank selection unit is configured to select one of the first memory bank and the second memory bank in response to a multi-bit test signal and bank address signals.

8. The semiconductor memory apparatus according to claim 5, wherein the row selection unit comprises:
   a control section configured to generate control signals in response to a row address signal;
   a first selection section configured to selectively communicate with the half from each of the first up bank and the second up bank and the other remaining half from each of the first up bank and the second up bank in response to the control signals; and
   a second selection section configured to selectively communicate with the half from each of the first down bank and the second down bank and the other remaining half from each of the first down bank and the second down bank in response to the control signals, and
   wherein the first selection section is coupled with the first test input/output line, and the second selection section is coupled with the second test input/output line.

9. A semiconductor memory apparatus comprising:
   memory banks, each memory bank comprising sub banks,
   wherein the semiconductor memory apparatus is configured to allocate different test input/output lines to a plurality of sub banks which are comprised of one memory bank and arranged in different groups during a multi-bit test.

10. The semiconductor memory apparatus according to claim 9, comprising:
    a bank selection unit configured to select all of the sub banks comprising one memory bank.

11. The semiconductor memory apparatus according to claim 10, wherein the bank selection unit selects all of the sub banks comprising one memory bank in response to a multi-bit test signal and bank address signals.

12. The semiconductor memory apparatus according to claim 9, further comprising:

a row selection unit configured to select a half from each of the sub banks comprising one memory bank and the other remaining half from each of the sub banks comprising the memory bank, wherein each of the sub banks comprising the memory bank is comprised of two halves of memory units.

13. The semiconductor memory apparatus according to claim 12, wherein the row selection unit comprises:

a control section configured to generate control signals in response to a row address signal; and a selection section configured to selectively communicate with the half from each of the sub banks and the other remaining half from each of the sub banks in response to the control signals, wherein the selection section is coupled with the test input/output line.

* * * * *